(12) United States Patent
Mule' et al.

(10) Patent No.: US 12,119,344 B2
(45) Date of Patent: Oct. 15, 2024

(54) MULTI-LAYER ETCH STOP LAYERS FOR ADVANCED INTEGRATED CIRCUIT STRUCTURE FABRICATION

(71) Applicant: Intel Corporation, Santa Clara, CA (US)

(72) Inventors: Anthony V. Mule', Portland, OR (US); David J. Towner, Portland, OR (US); Dragos Seghete, Portland, OR (US); Christopher R. Ryder, Portland, OR (US); Angel Aquino Gonzalez, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 871 days.

(21) Appl. No.: 17/033,440

(22) Filed: Sep. 25, 2020

(65) Prior Publication Data

US 2022/0102343 A1    Mar. 31, 2022

(51) Int. Cl.

| | |
|---|---|
| *H01L 27/088* | (2006.01) |
| *H01L 23/538* | (2006.01) |
| *H01L 29/417* | (2006.01) |
| *H01L 29/78* | (2006.01) |

(52) U.S. Cl.
CPC ...... *H01L 27/0886* (2013.01); *H01L 23/5384* (2013.01); *H01L 23/5386* (2013.01); *H01L 29/41791* (2013.01); *H01L 29/785* (2013.01)

(58) Field of Classification Search
CPC ............... H01L 21/76835; H01L 21/76832
See application file for complete search history.

(56) References Cited

U.S. PATENT DOCUMENTS

| | | | | |
|---|---|---|---|---|
| 2016/0066439 | A1* | 3/2016 | Ando ............... | H05K 1/181 |
| | | | | 361/752 |
| 2016/0148870 | A1* | 5/2016 | Hegde ............ | H01L 23/53252 |
| | | | | 257/774 |
| 2017/0278747 | A1* | 9/2017 | Adusumilli ...... | H01L 21/76897 |
| 2018/0350634 | A1* | 12/2018 | Li .................. | H01L 21/76814 |
| 2018/0350662 | A1* | 12/2018 | You ................ | H01L 29/785 |
| 2020/0035549 | A1* | 1/2020 | Wu ................. | H01L 21/76805 |
| 2021/0098287 | A1* | 4/2021 | Park ............... | H01L 21/76885 |

\* cited by examiner

*Primary Examiner* — John A Bodnar
(74) *Attorney, Agent, or Firm* — Schwabe, Williamson & Wyatt P.C.

(57) ABSTRACT

Multi-layer etch stop layers are described. In an example, an integrated circuit structure includes a conductive line in a first interlayer dielectric material above a substrate. A first dielectric etch stop layer, a second dielectric layer and a third dielectric layer are on the conductive line and the first interlayer dielectric material. A second interlayer dielectric material is on the third dielectric etch stop layer. An opening is in the second interlayer dielectric material, in the third dielectric etch stop layer, and in the second dielectric etch stop layer, in the first dielectric etch stop layer. A conductive structure is in the opening, the conductive structure in direct contact with the conductive line.

23 Claims, 10 Drawing Sheets

MULTI-LAYER ETCH STOP LAYERS FOR ADVANCED INTEGRATED CIRCUIT STRUCTURE FABRICATION

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming. Additionally, constraints on corresponding back-end-of-line (BEOL) metallization layers have also become overwhelming.

DESCRIPTION OF THE EMBODIMENTS

Figure 1A:
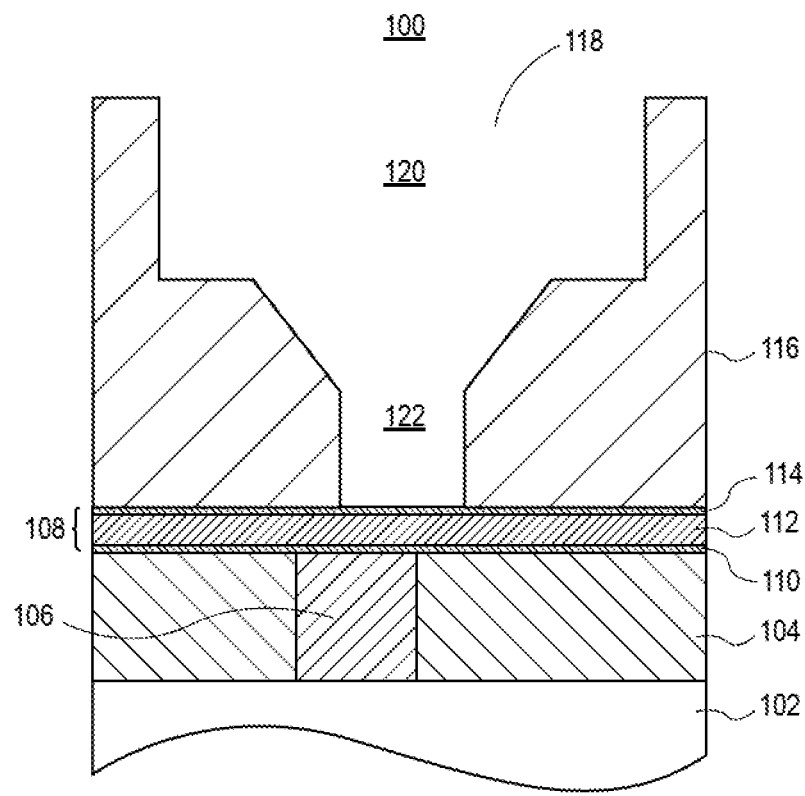
FIGS. 1A-1E illustrate cross-sectional views illustrating various operations in a method of fabricating a multi-layer structure using a multi-layer etch stop layer, in accordance with an embodiment of the present disclosure.

Multi-layer etch stop layers, and methods of fabricating integrated circuit structures using multi-layer etch stop layers, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, a tri-layer etch stop using wet-strip removable aluminum oxide layers for enhanced dry etch selectivity in BEOL manufacturing is described. In accordance with another embodiment of the present disclosure, a tri-layer etch stop using wet-strip removable aluminum oxide layers for enhanced dry etch selectivity in FEOL manufacturing is described.

One or more embodiments may be implemented to provide high dry-etch selectivity for via and break-through etch steps to mitigate punch-through (i.e., Cu or Co or other underlying metal attack/corrosion) that otherwise results when vias and trenches of wildly different sizes (e.g., 1× versus 5× wide lines and vias) etch at very different rates. Such differences often result in larger structures etching faster and landing on Cu much sooner, and can ultimately result in increased etch exposure in the large structures while the small structures complete their dielectric etch, during which time the Cu is attacked and re-sputtered/corroded, leading to Cu voids that end in open chains and suppressed yield. In an embodiment, by enabling via and/or break-through (BT) etch operations to land selectively on aluminum-oxide layers, instead of either Cu (e.g., FIGS. 1A-1E) or another dielectric (e.g., FIGS. 3A-3D) with otherwise poor selectivity to the etch, large structures complete their etch and do not attack underlying Cu or dielectric.

Embodiments may be implemented to address unreasonably tight across-wafer depth uniformity, tight narrow-to-wide via and trench depth loading, which otherwise prove difficult for a given product, and the difficulty is amplified across product offerings. In an embodiment, a tri-layer (Al—O/ES/Al—O) is implemented as a composite or multi-layer etch stop (ES) where Al—O layers serve as hard stops for via and break-through trench etch operations. Improved yield and reliability may be achieved by avoiding punch-through and corrosion of underlying Cu or Co or other metals and improving shorting margin by prohibiting/mitigating un-landed vias. In an embodiment, a relative thicknesses of the composite layers is on the order of 5-to-1 for ES-to-Al—O.

In an aspect, back end of line (BEOL) layers of integrated circuits commonly include electrically conductive microelectronic structures, which are known in the art as vias, to electrically connect metal lines or other interconnects above the vias to metal lines or other interconnects below the vias. In accordance with one or more embodiments of the present disclosure, a multi-layer etch stop layer is used to fabricate a BEOL structure of an integrated circuit. FIGS. 1A-1E illustrate cross-sectional views illustrating various operations in a method of fabricating a multi-layer structure using a multi-layer etch stop layer, in accordance with an embodiment of the present disclosure.

Referring to FIG. 1A, a starting structure 100 includes a conductive line 106 in a first interlayer dielectric (ILD) material 104 above a substrate 102. A multi-layer etch stop layer 108 is over the conductive line 106 and the first interlayer dielectric material 104. The multi-layer etch stop layer 108 includes a first dielectric etch stop layer 110 directly on and continuous over the conductive line 106 and the first interlayer dielectric material 104. The multi-layer etch stop layer 108 also includes a second dielectric etch stop layer 112 directly on and continuous over the first dielectric etch stop layer 110. The second dielectric etch stop layer 112 is distinct from the first dielectric etch stop layer 110. The multi-layer etch stop layer 108 also includes a third dielectric etch stop layer 114 directly on and continuous over the second dielectric etch stop layer 112. The third dielectric etch stop layer 114 is distinct from the second dielectric etch stop layer 112. A second interlayer dielectric (ILD) material 116 is on the third dielectric etch stop layer 114 of the multi-layer etch stop layer 108.

Referring again to FIG. 1A, an opening 118 is formed in the second ILD material 116. The opening 118 may include a trench portion 120 and a via portion 122. In an embodiment, opening 118 is formed in ILD material 116 using dry or plasma etch process. The etch process stops on the third dielectric etch stop layer 114. In one embodiment, the etch used to form opening 118 lands with greater than 10:1, and preferably more than 20:1 selectivity to the third dielectric etch stop layer 114. In doing so, there is minimal to no loss or erosion of conductive line 106 and/or first interlayer dielectric (ILD) material 104 as a result of the etch process used to form opening 118. Also, there is minimal to no loss or erosion of conductive line 106 and/or first interlayer dielectric (ILD) material 104 as a result of cleans processes subsequently used to clean opening 118 prior to further processing, where such cleans processes may otherwise undesirably oxidize and erode conductive line 106.

Figure 1B:
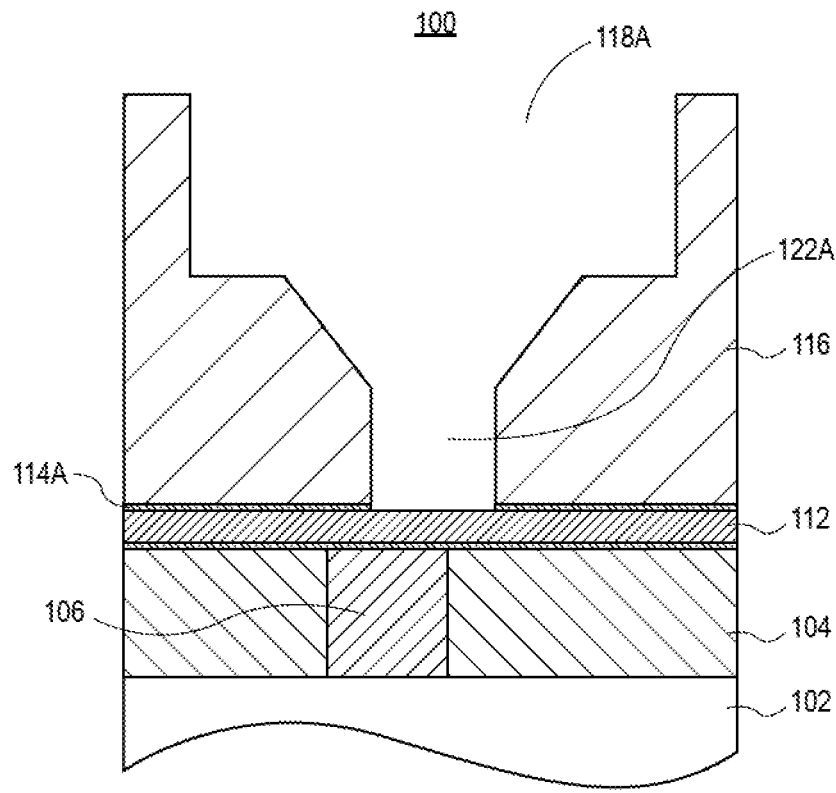

Referring to FIG. 1B, the via portion 122 of opening 118 is extended through the third dielectric etch stop layer 114 to form opening 118A having via portion 122A and patterned third dielectric etch stop layer 114A. In one embodiment, the third dielectric etch stop layer 114 is etched using a wet etch process, examples of which are described below.

Figure 1C:
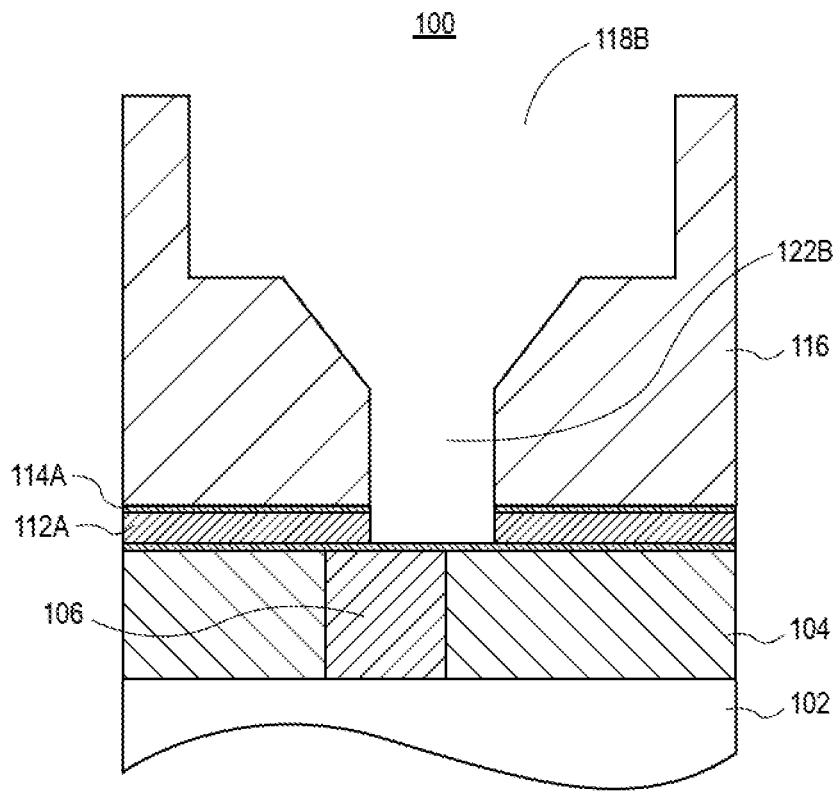

Referring to FIG. 1C, the via portion 122A of opening 118A is then extended through the second dielectric etch stop layer 112 to form opening 118B having via portion 122B, and forming patterned second dielectric etch stop layer 112A. In one embodiment, the second dielectric etch stop layer 112 is etched using a dry or plasma etch process, examples of which are described below.

Figure 1D:
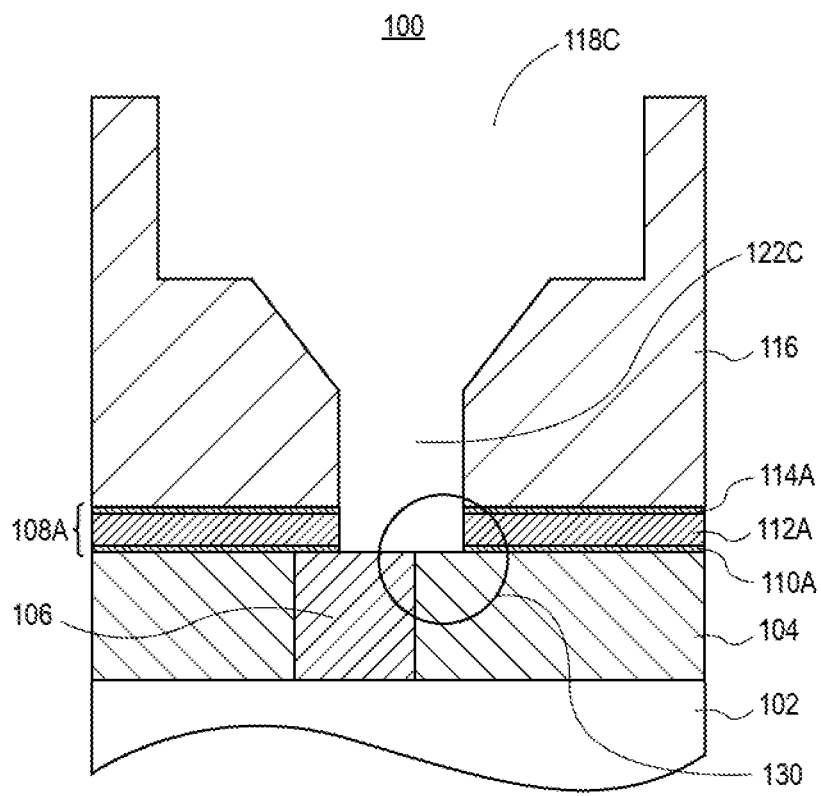

Referring to FIG. 1D, the via portion 122B of opening 118B is extended through the first dielectric etch stop layer 110 to form opening 118C having via portion 122C and patterned first dielectric etch stop layer 110A, providing patterned multi-layer etch stop structure 108A. In one embodiment, the first dielectric etch stop layer 110 is etched using a wet etch process, examples of which are described below.

In an embodiment, via portion 122C of opening 118C is formed in a first wet etch process to etch third etch stop layer 114, a dry or plasma etch process to etch second dielectric etch stop layer 112, and a second wet etch process to etch first etch stop layer 110. In accordance with embodiments of the present disclosure, erosion of conductive line 106 and/or first interlayer dielectric material 104 is substantially mitigated or altogether eliminated, e.g., as shown at location 130 of FIG. 1D, by a process involving first 110, second 112 and third 114 dielectric etch stop layers, as compared with a process that does not involve use of first 110, second 112 and third 114 dielectric etch stop layers.

Figure 1E:
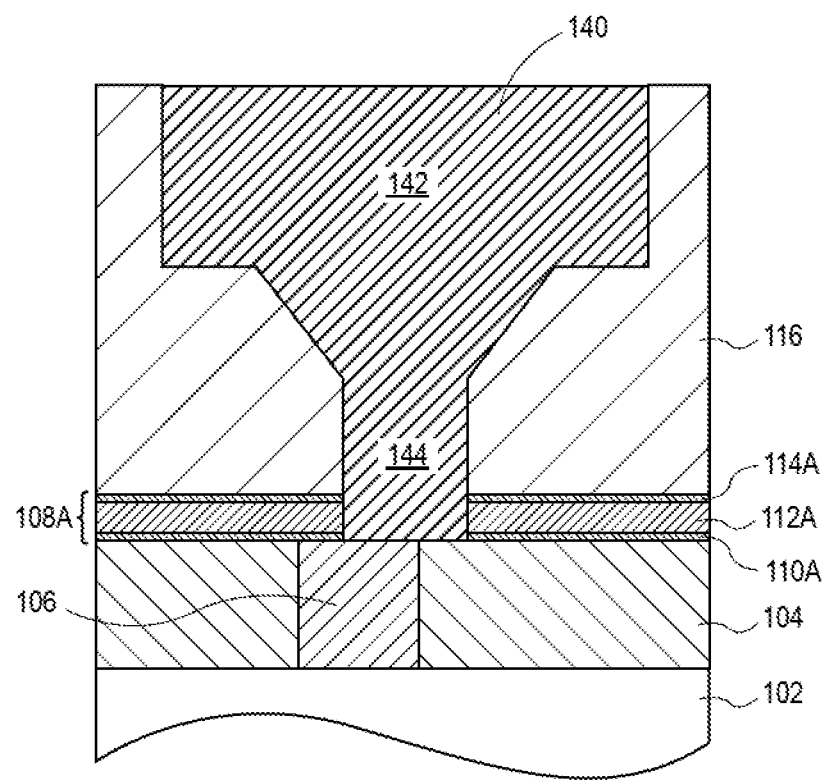

Referring to FIG. 1E, a conductive structure 140 is formed in opening 118C. In an embodiment, conductive structure 140 includes an upper conductive line or interconnect 142 and a lower conductive via 144, as is depicted.

Referring to FIGS. 1A-1E, in an embodiment, second ILD material 116 is a low-k material. In a particular embodiment, second ILD material 116 is a carbon doped oxide (CDO) material which may also be referred to as a SiOCH film, since the material includes silicon, oxygen, carbon and hydrogen. In an embodiment, opening 118 is formed in second ILD material 116 using a fluorine-based dry or plasma etch process.

In an embodiment, first and third etch stop layers 110 and 114 are highly resistant to a fluorine-based dry or plasma etch process used to form opening 122 in ILD material 116.

In an embodiment, the first and third etch stop layers 110 and 114 include a metal oxide material. In one such embodiment, the metal oxide material is an aluminum oxide material. In a particular such embodiment, the first and third etch stop layers 110 and 114 includes approximately 35-40 atomic % aluminum and 60-65 atomic % oxygen. Impurities may also be included, such as 0.5-1 atomic percent hydrogen and 0.1-0.5 atomic % carbon. In an embodiment, the first and third etch stop layer 110 and 114 are or include an aluminum oxide material formed using atomic deposition (ALD) with trimethylaluminum (TMA) and water as precursors. In an embodiment, the first and third etch stop layers 110 and 114 are or include an amorphous material layer. In an embodiment, the first and third etch stop layers 110 and 114 each have a thickness in the range of 20-120 Angstroms.

In an embodiment, the first and third etch stop layers 110 and 114 are etchable by a highly selective wet etch process, such as a wet etch process involving use of a glycol ether, a cyclic amine, a glycol, an amine, or a combination of two or more thereof. Not to be bound by theory, in an embodiment, one or both of the first and third etch stop layers 110 and/or 114 become surface-fluorinated during the fluorine-based dry or plasma etch process used to form opening 118. Upon exposure to the wet etch, HF may be formed as a very localized etchant for patterning the first and/or third etch stop layers 110 and 114. It is to be appreciated that use of an aluminum oxide as a metal oxide material for first and third etch stop layers 110 and 114 may have superior wet etch characteristics as compared against other metal oxides (such as titanium oxide, hafnium oxide or zirconium oxide) which have proven difficult to wet etch.

In an embodiment, second etch stop layer 112 is highly resistant to the wet etch process used to pattern first and third dielectric etch stop layers 110 and 114. In an embodiment, the second etch stop layer 112 includes a silicon nitride material. In one such embodiment, the silicon nitride material has a lower dielectric constant than the metal oxide material of the first and third dielectric etch stop layers 110 and 114. In a particular such embodiment, the second etch stop layer 112 includes approximately 40-50 atomic % nitrogen, 30-40 atomic % silicon, and 10-20 atomic % hydrogen. Impurities may also be included, such as 1-2 atomic percent oxygen. In an embodiment, the second etch stop layer 112 is an amorphous material layer. In an embodiment, the second etch stop layer 112 has a thickness in the range of 50-150 Angstroms.

Figure 2:
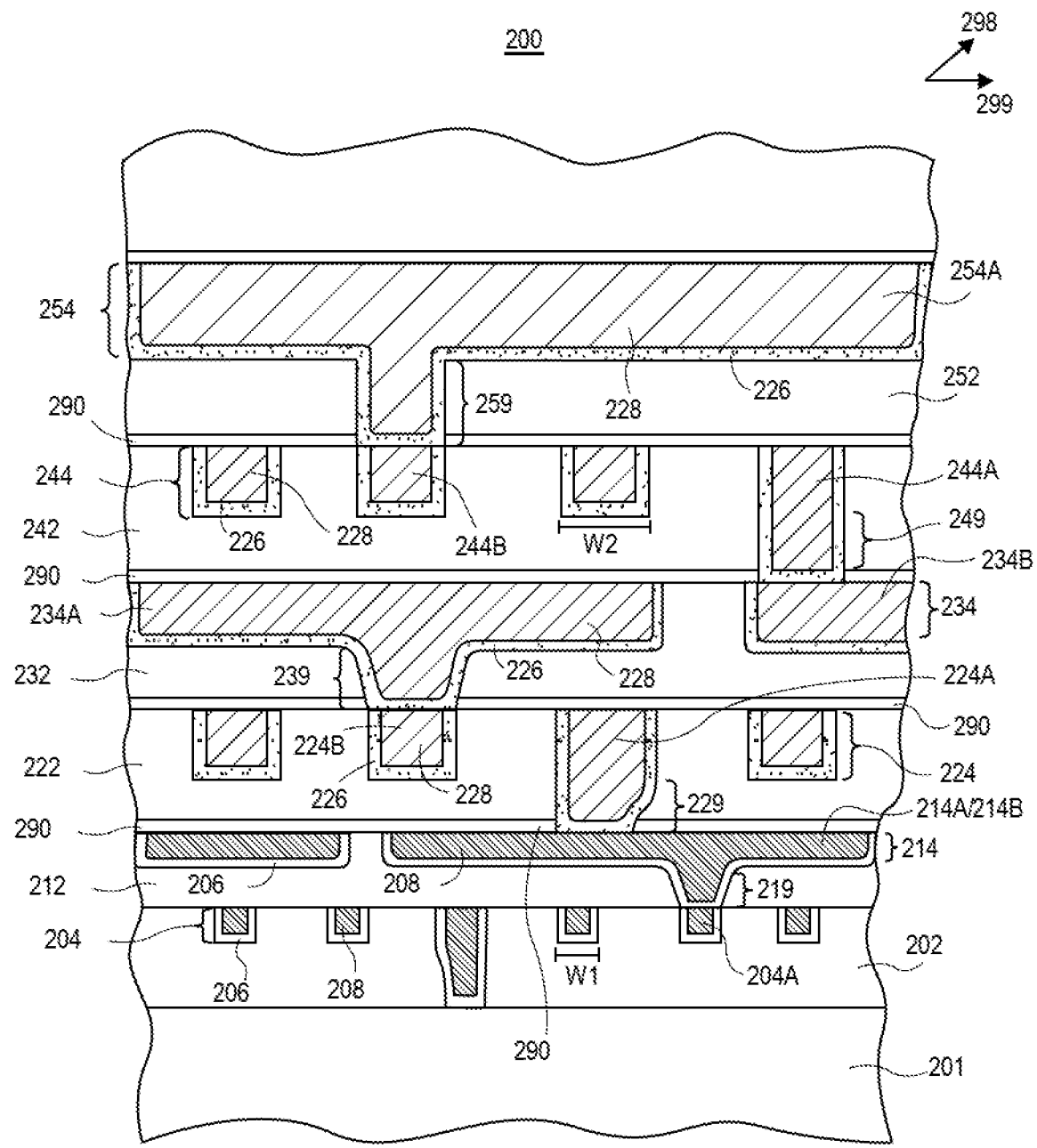
FIG. 2 illustrates a cross-sectional view of an integrated circuit structure having four metallization layers with a metal line composition and pitch above two metallization layers with a differing metal line composition and smaller pitch, and including multi-layer etch stop layers, in accordance with an embodiment of the present disclosure.

As an exemplary but non-limiting BEOL structure, FIG. 2 illustrates a cross-sectional view of an integrated circuit structure having four metallization layers with a metal line composition and pitch above two metallization layers with a differing metal line composition and smaller pitch, and including multi-layer etch stop layers, in accordance with an embodiment of the present disclosure.

Referring to FIG. 2, an integrated circuit structure 200 includes a first plurality of conductive interconnect lines 204 in and spaced apart by a first inter-layer dielectric (ILD) layer 202 above a substrate 201. Individual ones of the first plurality of conductive interconnect lines 204 include a first conductive barrier material 206 along sidewalls and a bottom of a first conductive fill material 208. Individual ones of the first plurality of conductive interconnect lines 204 are along a first direction 298 (e.g., into and out of the page).

A second plurality of conductive interconnect lines 214 is in and spaced apart by a second ILD layer 212 above the first ILD layer 202. Individual ones of the second plurality of conductive interconnect lines 214 include the first conductive barrier material 206 along sidewalls and a bottom of the first conductive fill material 208. Individual ones of the second plurality of conductive interconnect lines 214 are along a second direction 299 orthogonal to the first direction 298.

A third plurality of conductive interconnect lines 224 is in and spaced apart by a third ILD layer 222 above the second ILD layer 212. Individual ones of the third plurality of conductive interconnect lines 224 include a second conductive barrier material 226 along sidewalls and a bottom of a second conductive fill material 228. The second conductive fill material 228 is different in composition from the first conductive fill material 208. Individual ones of the third plurality of conductive interconnect lines 224 are along the first direction 298.

A fourth plurality of conductive interconnect lines 234 is in and spaced apart by a fourth ILD layer 232 above the third ILD layer 222. Individual ones of the fourth plurality of conductive interconnect lines 234 include the second conductive barrier material 226 along sidewalls and a bottom of the second conductive fill material 228. Individual ones of the fourth plurality of conductive interconnect lines 234 are along the second direction 299.

A fifth plurality of conductive interconnect lines 244 is in and spaced apart by a fifth ILD layer 242 above the fourth ILD layer 232. Individual ones of the fifth plurality of conductive interconnect lines 244 include the second conductive barrier material 226 along sidewalls and a bottom of the second conductive fill material 228. Individual ones of the fifth plurality of conductive interconnect lines 244 are along the first direction 298.

A sixth plurality of conductive interconnect lines 254 is in and spaced apart by a sixth ILD layer 252 above the fifth ILD layer 242. Individual ones of the sixth plurality of conductive interconnect lines 254 include the second conductive barrier material 226 along sidewalls and a bottom of the second conductive fill material 228. Individual ones of the sixth plurality of conductive interconnect lines 254 are along the second direction 299.

In an embodiment, the second conductive fill material 228 consists essentially of copper, and the first conductive fill material 208 consists essentially of cobalt. In an embodiment, the first conductive fill material 208 includes copper having a first concentration of a dopant impurity atom, and the second conductive fill material 228 includes copper having a second concentration of the dopant impurity atom, the second concentration of the dopant impurity atom less than the first concentration of the dopant impurity atom.

In an embodiment, the first conductive barrier material 206 is different in composition from the second conductive barrier material 226. In another embodiment, the first conductive barrier material 206 and the second conductive barrier material 226 have the same composition.

In an embodiment, a first conductive via 219 is on and electrically coupled to an individual one 204A of the first plurality of conductive interconnect lines 204. An individual one 214A of the second plurality of conductive interconnect lines 214 is on and electrically coupled to the first conductive via 219.

A second conductive via 229 is on and electrically coupled to an individual one 214B of the second plurality of conductive interconnect lines 214. An individual one 224A of the third plurality of conductive interconnect lines 224 is on and electrically coupled to the second conductive via 229.

A third conductive via 239 is on and electrically coupled to an individual one 224B of the third plurality of conductive interconnect lines 224. An individual one 234A of the fourth plurality of conductive interconnect lines 234 is on and electrically coupled to the third conductive via 239.

A fourth conductive via 249 is on and electrically coupled to an individual one 234B of the fourth plurality of conductive interconnect lines 234. An individual one 244A of the fifth plurality of conductive interconnect lines 244 is on and electrically coupled to the fourth conductive via 249.

A fifth conductive via 259 is on and electrically coupled to an individual one 244B of the fifth plurality of conductive interconnect lines 244. An individual one 254A of the sixth plurality of conductive interconnect lines 254 is on and electrically coupled to the fifth conductive via 259.

In one embodiment, the first conductive via 219 includes the first conductive barrier material 206 along sidewalls and a bottom of the first conductive fill material 208. The second 229, third 239, fourth 249 and fifth 259 conductive vias include the second conductive barrier material 226 along sidewalls and a bottom of the second conductive fill material 228.

In an embodiment, the second 212, third 222, fourth 232, fifth 242 and sixth 252 ILD layers are separated from one another by a corresponding etch-stop layer 290 between adjacent ILD layers. In one embodiment, one or more of the etch stop layers 290 is a multi-layer etch stop layer, such as described above. In an embodiment, the first 202, second 212, third 222, fourth 232, fifth 242 and sixth 252 ILD layers include silicon, carbon and oxygen.

In an embodiment, individual ones of the first 204 and second 214 pluralities of conductive interconnect lines have a first width (W1). Individual ones of the third 224, fourth 234, fifth 244 and sixth 254 pluralities of conductive interconnect lines have a second width (W2) greater than the first width (W1).

In another aspect, in accordance with an embodiment of the present disclosure, in a FEOL scheme, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In technologies where space and layout constraints are somewhat relaxed compared with current generation space and layout constraints, a contact to gate structure may be fabricated by making contact to a portion of the gate electrode disposed over an isolation region. Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., trench insulating layer (TILA)). The additional dielectric material is included as a trench contact dielectric cap layer with etch characteristics different from the gate dielectric material cap layer used for trench contact alignment in a gate aligned contact process (GAP) processing scheme (e.g., use of a gate insulating layer (GILA)).

In accordance with one or more embodiments of the present disclosure, etch stop layers stacks are implemented to provide for improved via contact selectivity to TILA/GILA and for substantially improved yield. In an embodiment, a via opening etch lands on an upper dielectric etch stop layer with very high selectivity. The upper dielectric etch stop layer is etched with selectivity to an underlying lower dielectric etch stop layer. The lower dielectric etch stop layer is then etched to expose underlying TILA/GILA regions. The multi-operation breakthrough process may be implemented to reduce loss to the underlying TILA/GILA regions and enable significant yield improvement.

As an exemplary fabrication scheme, FIGS. 3A-3D illustrate cross-sectional views illustrating various operations in a method of fabricating a contact over active gate (COAG) structures using a multi-layer etch stop layer, in accordance with an embodiment of the present disclosure.

Figure 3A:
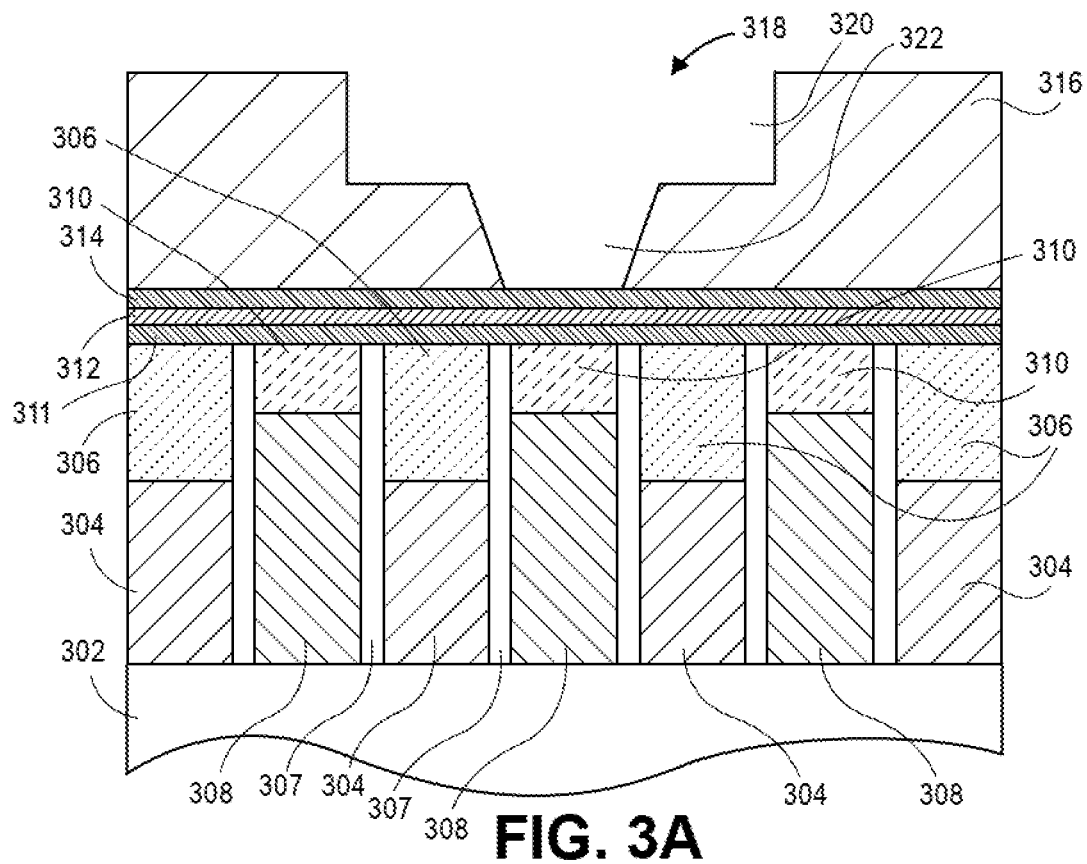
FIGS. 3A-3D illustrate cross-sectional views illustrating various operations in a method of fabricating a contact over active gate (COAG) structures using a multi-layer etch stop layer, in accordance with an embodiment of the present disclosure.

Referring to FIG. 3A, a plurality of gate structures 304 is formed above a fin or substrate 302. Gate structures 304 may include a gate dielectric and gate electrode. Each of the gate structures 304 includes a gate insulating layer (GILA) 306 or gate dielectric cap thereon. Dielectric spacers 307 may be along sidewalls of the each gate stack 304/GILA 306 pairing. The gate structures 304 alternate with conductive trench contact structures 308. Each of the conductive trench contact structures 308 includes a trench insulating layer (TILA) 310 or contact dielectric cap thereon. A first dielectric etch stop layer 311 is directly on and is continuous over the trench insulating layers 310 and the gate insulating layers 306 and, possibly, the dielectric spacers 307. A second dielectric etch stop layer 312 is directly on and continuous over the first dielectric etch stop layer 311. The second dielectric etch stop layer 312 is distinct from the first dielectric etch stop layer 311. A third dielectric etch stop layer 314 is directly on and continuous over the second dielectric etch stop layer 312. The third dielectric etch stop layer 314 is distinct from the second dielectric etch stop layer 312. An interlayer dielectric (ILD) material 316 is on the third dielectric etch stop layer 314.

Referring again to FIG. 3A, an opening 318 is formed in the ILD material 316. The opening 318 may include a trench portion 320 and a via portion 322. In an embodiment, opening 318 is formed in ILD material 316 using dry or plasma etch process. The etch process stops on the third dielectric etch stop layer 314. In one embodiment, the etch used to form opening 318 lands with greater than 10:1, and preferably more than 20:1 selectivity to the third dielectric etch stop layer 314. In doing so, there is minimal to no loss or erosion of TILA/GILA structures as a result of the etch process used to form opening 318. Also, there is minimal to no loss or erosion of TILA/GILA structures as a result of cleans processes subsequently used to clean opening 318 prior to further processing, where such cleans processes may otherwise undesirably oxidize TILA/GILA surfaces.

Figure 3B:
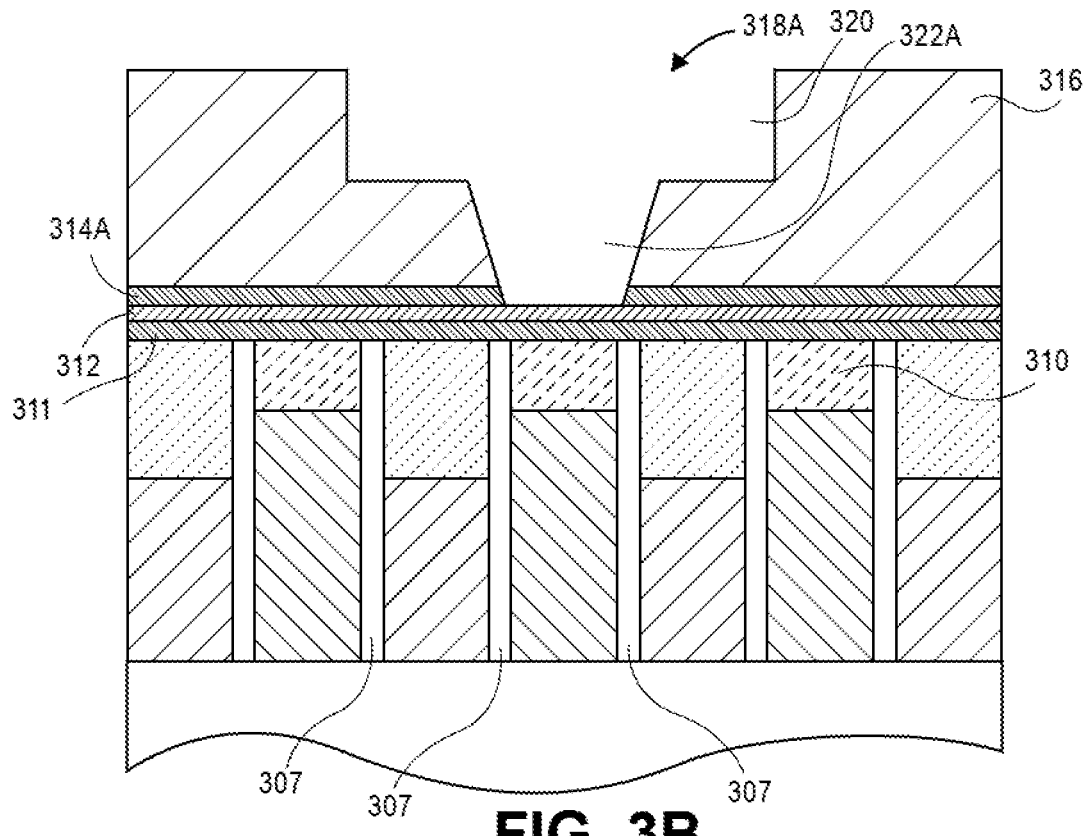

Referring to FIG. 3B, the via portion 322 of opening 318 is extended through the third dielectric etch stop layer 314 to form opening 318A having via portion 322A and patterned third dielectric etch stop layer 314A.

Figure 3C:
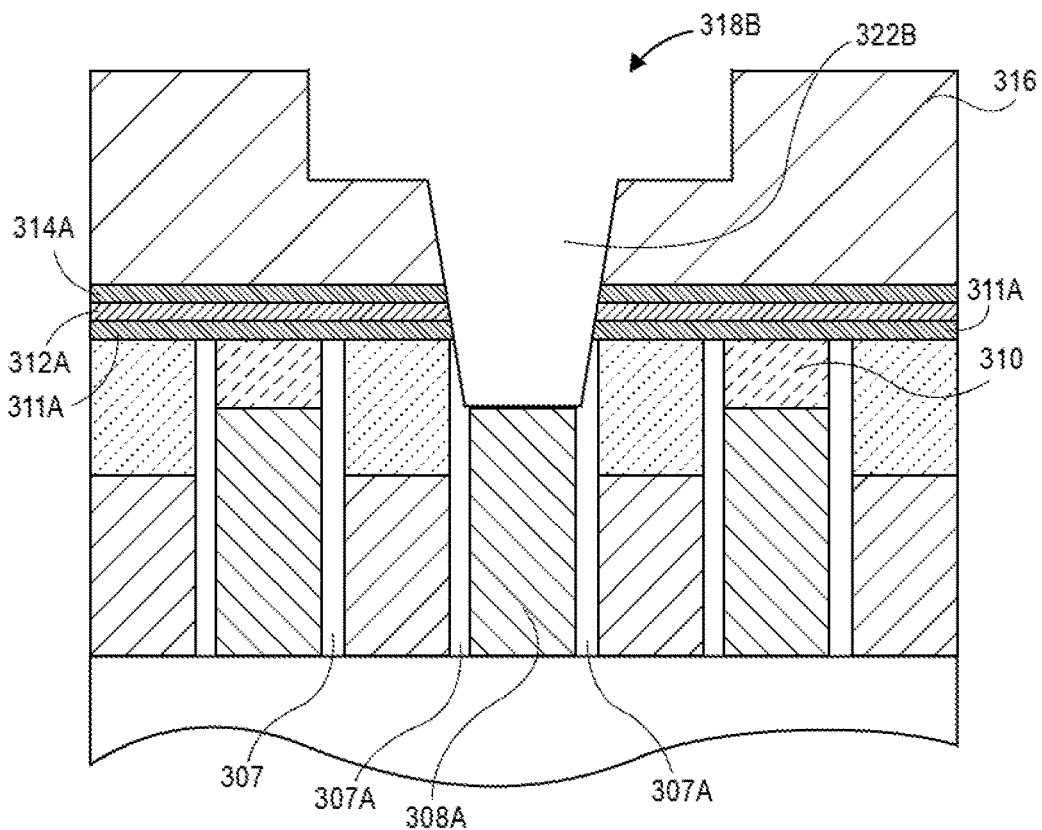

Referring to FIG. 3C, the via portion 322A of opening 318A is then extended through the second dielectric etch stop layer 312 and the first dielectric etch stop layer 311 to form opening 318B having via portion 322B, and forming patterned second dielectric etch stop layer 312A and patterned first dielectric etch stop layer 311A. In one embodiment, the via opening 322B extends into (e.g., removes) one of the TILA structures 310 to expose a corresponding one 308A of the trench contact structures 308, as is depicted, for subsequent electrical contact formation. In another embodiment, not depicted, the via opening 322B extends into (e.g., removes) one of the GILA structures 306 to expose a corresponding one of the gate structures 304, for subsequent electrical contact formation.

In an embodiment, via portion 322B of opening 318B is formed in a first dry or plasma etch process that forms patterned second dielectric etch stop layer 312A, a wet etch process that forms patterned first dielectric etch stop layer, and a second dry or plasma etch process that removes the targeted TILA structure 310 (or GILA structure 306). It is to be appreciated that formation of via opening 322B may not remove the one of the TILA structures 310 with perfect selectivity to other exposed materials. For example, dielectric spacer erosion may occur to form eroded dielectric spacers 307A. Erosion may also extend into a neighboring GILA structure 306, as is depicted. Nonetheless, in accordance with embodiments of the present disclosure, such erosion is substantially mitigated by a process involving first 311, second 312 and third 314 dielectric etch stop layers, as compared with a process that does not involve use of first 311, second 312 and third 314 dielectric etch stop layers.

Figure 3D:
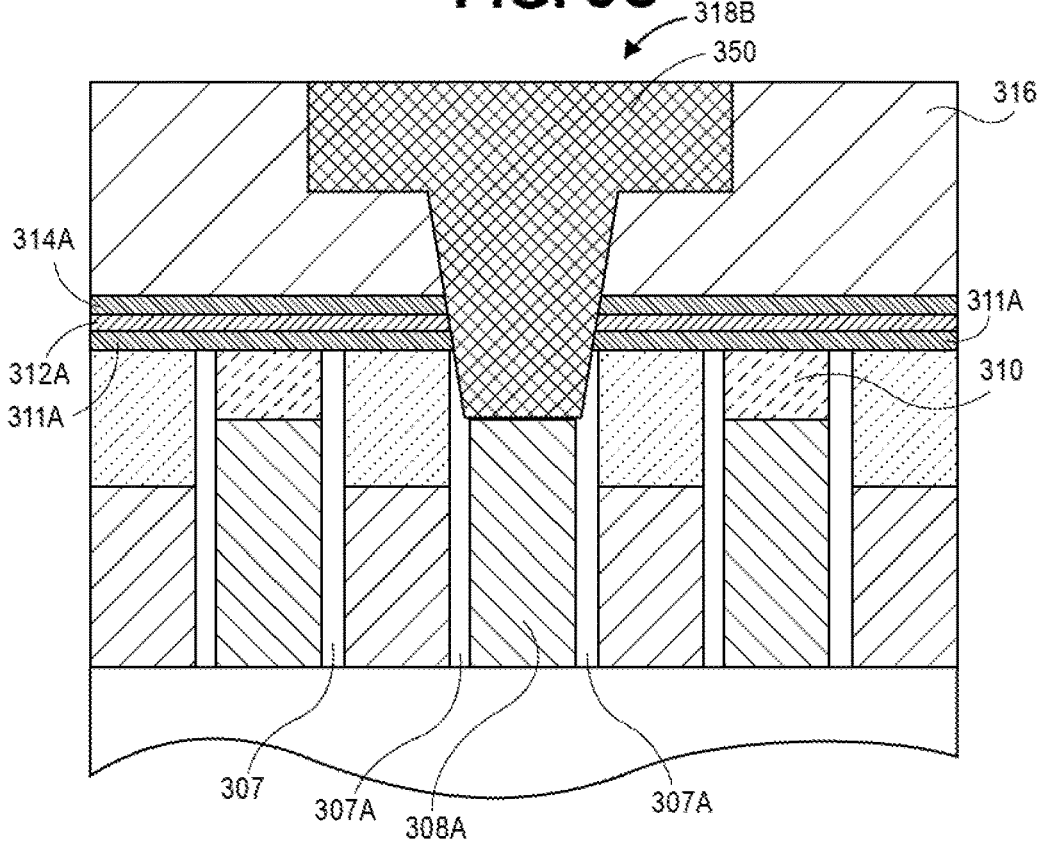

Referring to FIG. 3D, a conductive structure 350 is formed in opening 318B. In an embodiment, conductive structure 350 includes an upper conductive line or interconnect and a lower conductive via.

Referring to FIGS. 3A-3D, in an embodiment, ILD material 316 is a low-k material. In a particular embodiment, ILD material 316 is a carbon doped oxide (CDO) material which may also be referred to as a SiOCH film, since the material includes silicon, oxygen, carbon and hydrogen. In an embodiment, opening 318 is formed in ILD material 316 using a fluorine-based dry or plasma etch process.

In an embodiment, first and third etch stop layers 311 and 314 are highly resistant to a fluorine-based dry or plasma etch process used to form opening 322 in ILD material 316. In an embodiment, the first and third etch stop layers 311 and 314 include a metal oxide material. In one such embodiment, the metal oxide material is an aluminum oxide material. In a particular such embodiment, the first and third etch stop layers 311 and 314 includes approximately 35-40 atomic % aluminum and 60-65 atomic % oxygen. Impurities may also be included, such as 0.5-1 atomic percent hydrogen and 0.1-0.5 atomic % carbon. In an embodiment, the first and third etch stop layer 311 and 314 are or include an aluminum oxide material formed using atomic deposition (ALD) with trimethylaluminum (TMA) and water as precursors. In an embodiment, the first and third etch stop layers 311 and 314 are or include an amorphous material layer. In an embodiment, the first and third etch stop layers 311 and 314 each have a thickness in the range of 20-120 Angstroms.

In an embodiment, the first and third etch stop layers 311 and 314 are etchable by a highly selective wet etch process, such as a wet etch process involving use of a glycol ether, a cyclic amine, a glycol, an amine, or a combination of two or more thereof. Not to be bound by theory, in an embodiment, one or both of the first and third etch stop layers 311 and/or 314 become surface-fluorinated during the fluorine-based dry or plasma etch process used to form opening 318. Upon exposure to the wet etch, HF may be formed as a very localized etchant for patterning the first and/or third etch stop layers 311 and 314. It is to be appreciated that use of an aluminum oxide as a metal oxide material for first and third etch stop layers 311 and 314 may have superior wet etch characteristics as compared against other metal oxides (such as titanium oxide, hafnium oxide or zirconium oxide) which have proven difficult to wet etch.

In an embodiment, second etch stop layer 312 is highly resistant to the wet etch process used to pattern first and third dielectric etch stop layers 311 and 314. In an embodiment, the second etch stop layer 312 includes a silicon nitride material. In one such embodiment, the silicon nitride material has a lower dielectric constant than the metal oxide material of the first and third dielectric etch stop layers 311 and 314. In a particular such embodiment, the second etch stop layer 312 includes approximately 40-50 atomic % nitrogen, 30-40 atomic % silicon, and 10-20 atomic % hydrogen. Impurities may also be included, such as 1-2 atomic percent oxygen. In an embodiment, the second etch stop layer 312 is an amorphous material layer. In an embodiment, the second etch stop layer 312 has a thickness in the range of 50-150 Angstroms.

In an embodiment, GILA structures 306 are composed of a silicon nitride material having a different composition than a silicon nitride material of the second etch stop layer 312. In one such embodiment, GILA structures 306 are an amorphous silicon nitride material including approximately 50-55 atomic % nitrogen, 35-40 atomic % silicon, and 5-10 atomic % hydrogen. Impurities may also be included, such as 0.1-0.3 atomic percent oxygen and/or around 0.1% carbon. In an embodiment, the TILA structures 310 are composed of a silicon carbide material, such as a silicon carbide material formed in a high density plasma tool.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices.

For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL or BEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
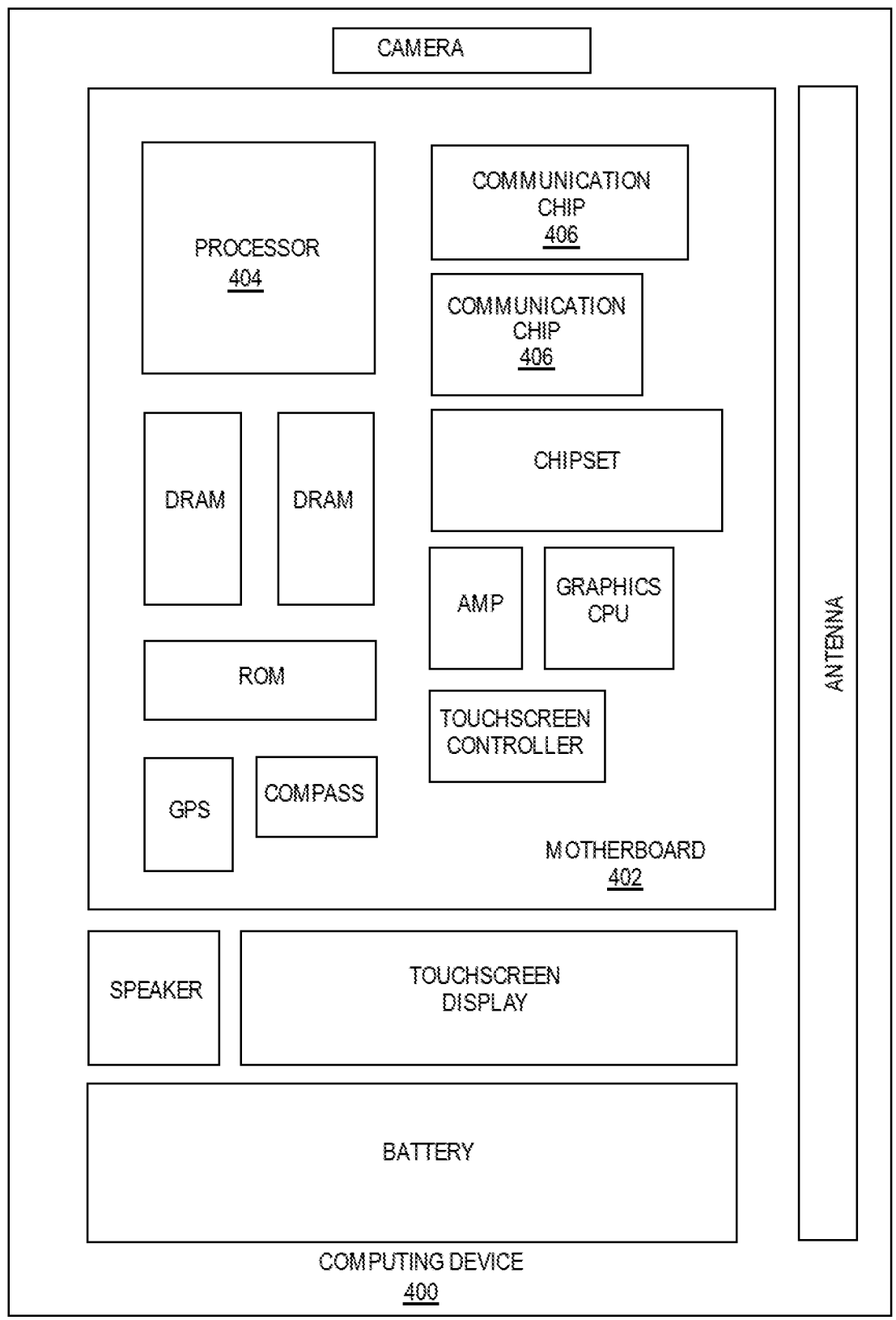
FIG. 4 illustrates a computing device in accordance with one implementation of the disclosure.

FIG. 4 illustrates a computing device 400 in accordance with one implementation of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of embodiments of the disclosure, the integrated circuit die of the processor includes one or more structures, such as an integrated circuit structure fabricated using a multi-layer etch stop layer and built in accordance with implementations of the disclosure. The term "processor" may refer to any device or portion of a device that processes electronic data from registers or memory to transform that electronic data, or both, into other electronic data that may be stored in registers or memory, or both.

The communication chip 406 also includes an integrated circuit die packaged within the communication chip 406. In accordance with another implementation of the disclosure, the integrated circuit die of the communication chip includes one or more structures, such as an integrated circuit structure fabricated using a multi-layer etch stop layer and built in accordance with implementations of the disclosure.

In further implementations, another component housed within the computing device 400 may include one or more structures, such as an integrated circuit structure fabricated using a multi-layer etch stop layer and built in accordance with implementations of the disclosure.

In various embodiments, the computing device 400 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
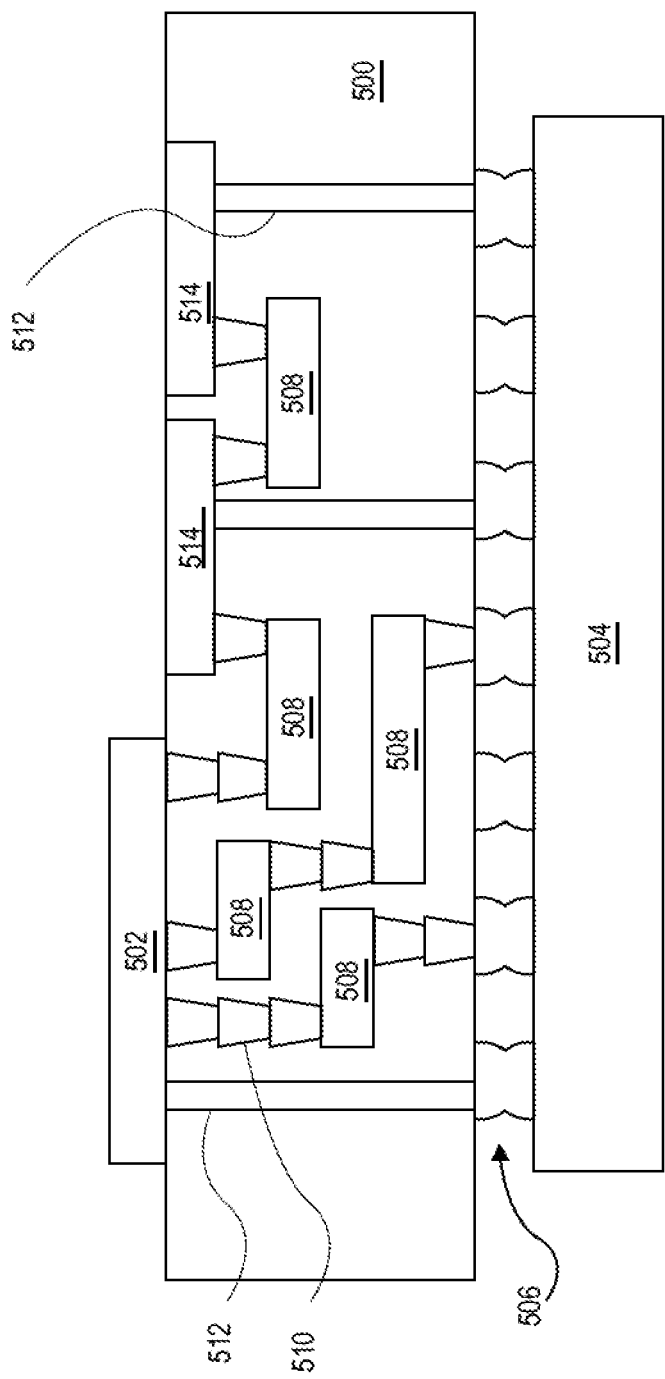
FIG. 5 illustrates an interposer that includes one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And, in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500 or in the fabrication of components included in the interposer 500.

Figure 6:
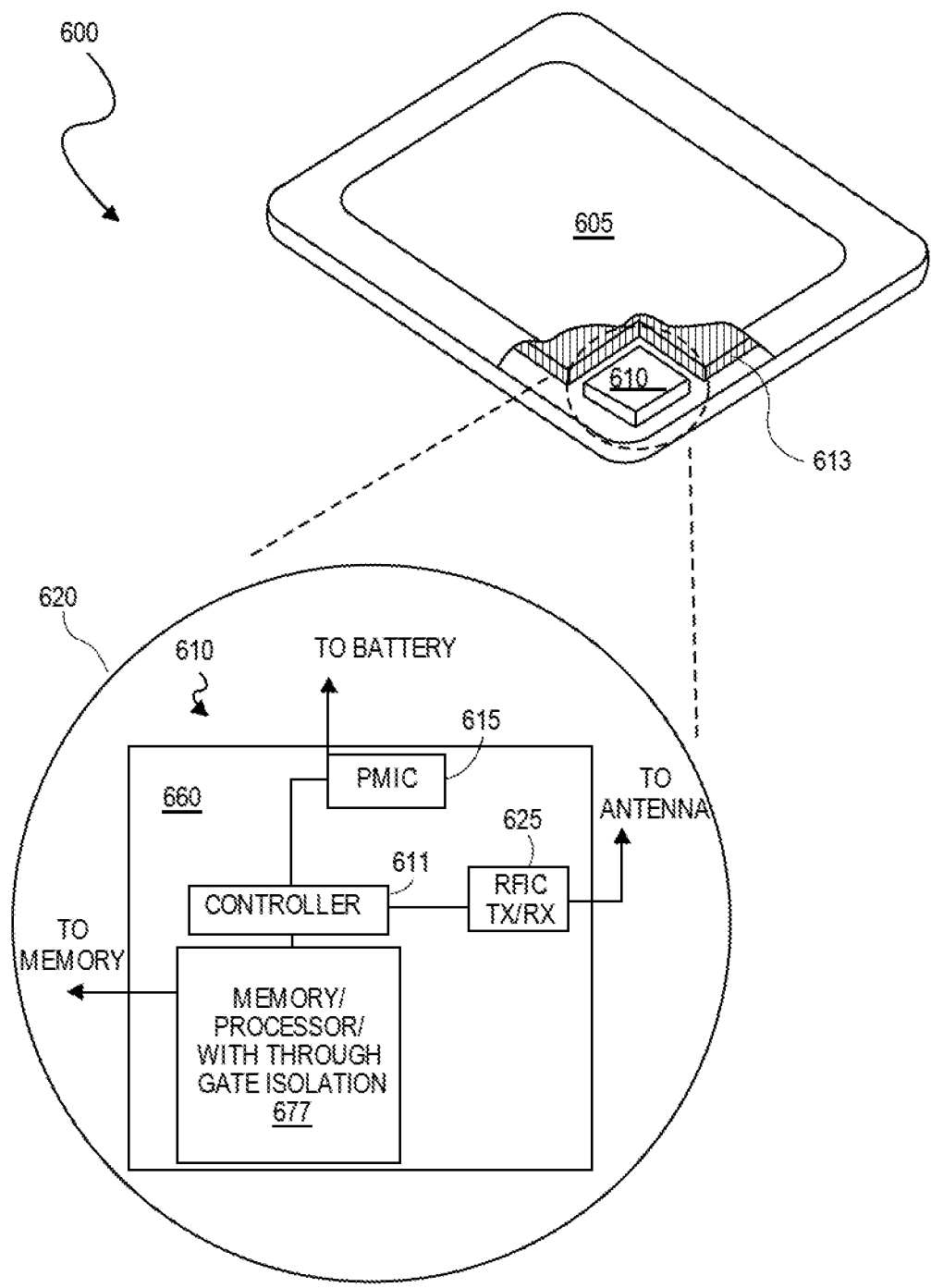
FIG. 6 is an isometric view of a mobile computing platform employing an IC fabricated according to one or more processes described herein or including one or more features described herein, in accordance with an embodiment of the present disclosure.

FIG. 6 is an isometric view of a mobile computing platform 600 employing an integrated circuit (IC) fabricated according to one or more processes described herein or including one or more features described herein, in accordance with an embodiment of the present disclosure.

The mobile computing platform 600 may be any portable device configured for each of electronic data display, electronic data processing, and wireless electronic data transmission. For example, mobile computing platform 600 may be any of a tablet, a smart phone, laptop computer, etc. and includes a display screen 605 which in the exemplary embodiment is a touchscreen (capacitive, inductive, resistive, etc.), a chip-level (SoC) or package-level integrated system 610, and a battery 613. As illustrated, the greater the level of integration in the system 610 enabled by higher transistor packing density, the greater the portion of the mobile computing platform 600 that may be occupied by the battery 613 or non-volatile storage, such as a solid state drive, or the greater the transistor gate count for improved platform functionality. Similarly, the greater the carrier mobility of each transistor in the system 610, the greater the functionality. As such, techniques described herein may enable performance and form factor improvements in the mobile computing platform 600.

The integrated system 610 is further illustrated in the expanded view 620. In the exemplary embodiment, packaged device 677 includes at least one memory chip (e.g., RAM), or at least one processor chip (e.g., a multi-core microprocessor and/or graphics processor) fabricated according to one or more processes described herein or including one or more features described herein. The packaged device 677 is further coupled to the board 660 along with one or more of a power management integrated circuit (PMIC) 615, RF (wireless) integrated circuit (RFIC) 625 including a wideband RF (wireless) transmitter and/or receiver (e.g., including a digital baseband and an analog front end module further includes a power amplifier on a transmit path and a low noise amplifier on a receive path), and a controller thereof 611. Functionally, the PMIC 615 performs battery power regulation, DC-to-DC conversion, etc., and so has an input coupled to the battery 613 and with an output providing a current supply to all the other functional modules. As further illustrated, in the exemplary embodiment, the RFIC 625 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 677 or within a single IC (SoC) coupled to the package substrate of the packaged device 677.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 7:
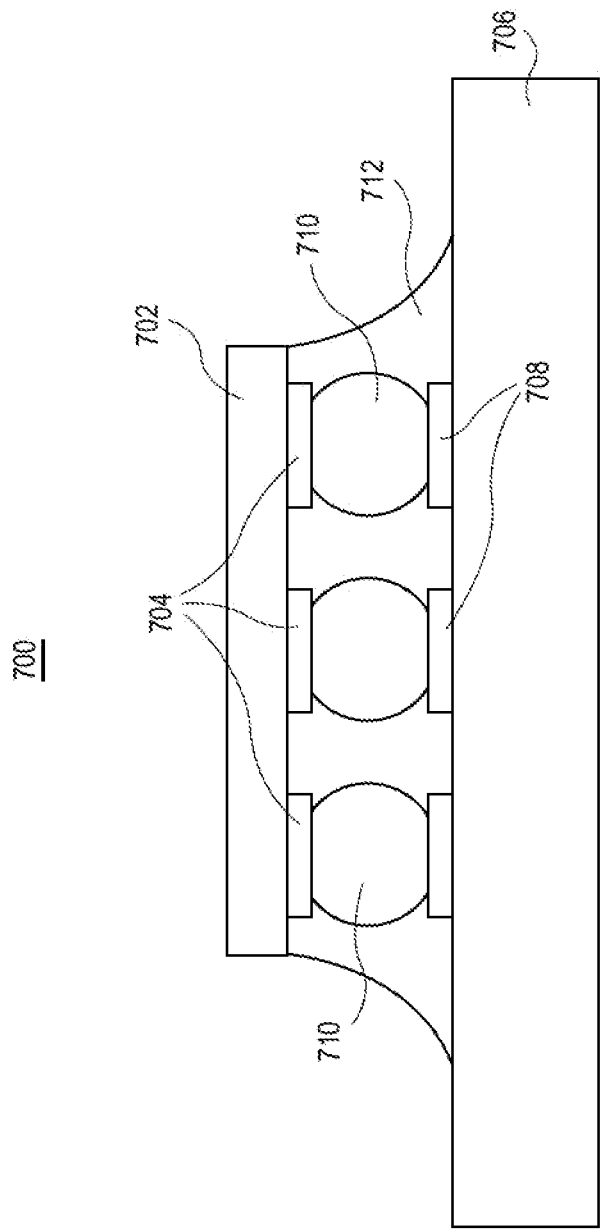
FIG. 7 illustrates a cross-sectional view of a flip-chip mounted die, in accordance with an embodiment of the present disclosure.

FIG. 7 illustrates a cross-sectional view of a flip-chip mounted die, in accordance with an embodiment of the present disclosure.

Referring to FIG. 7, an apparatus 700 includes a die 702 such as an integrated circuit (IC) fabricated according to one or more processes described herein or including one or more features described herein, in accordance with an embodiment of the present disclosure. The die 702 includes metallized pads 704 thereon. A package substrate 706, such as a ceramic or organic substrate, includes connections 708 thereon. The die 702 and package substrate 706 are electrically connected by solder balls 710 coupled to the metallized pads 704 and the connections 708. An underfill material 712 surrounds the solder balls 710.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include multi-layer etch stop layers, and methods of fabricating integrated circuit structures using multi-layer etch stop layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a conductive line in a first interlayer dielectric material above a substrate. A first dielectric etch stop layer is directly on the conductive line and the first interlayer dielectric material. A second dielectric etch stop layer is directly on and continuous over the first dielectric etch stop layer, the second dielectric etch stop layer distinct from the first dielectric etch stop layer. A third dielectric etch stop layer is directly on and continuous over the second dielectric etch stop layer, the third dielectric etch stop layer distinct from the second dielectric etch stop layer. A second interlayer dielectric material is on the third dielectric etch stop layer. An opening is in the second interlayer dielectric material, in the third dielectric etch stop layer, and in the second dielectric etch stop layer, in the first dielectric etch stop layer. A conductive structure is in the opening, the conductive structure in direct contact with the conductive line.

Example embodiment 2: The integrated circuit structure of example embodiment 1, wherein the first and third dielectric etch stop layers include aluminum and oxygen.

Example embodiment 3: The integrated circuit structure of example embodiment 1 or 2, wherein the second etch stop layer includes nitrogen, silicon and hydrogen.

Example embodiment 4: The integrated circuit structure of example embodiment 1, 2 or 3, wherein the interlayer dielectric material includes silicon, oxygen, carbon and hydrogen.

Example embodiment 5: The integrated circuit structure of example embodiment 1, 2, 3 or 4, wherein the conductive structure includes an upper conductive line and a lower conductive via.

Example embodiment 6: An integrated circuit structure includes a plurality of gate structures above substrate, each of the gate structures including a gate insulating layer thereon. A plurality of conductive trench contact structures is alternating with the plurality of gate structures, each of the conductive trench contact structures including a trench insulating layer thereon. A first dielectric etch stop layer is directly on and continuous over the trench insulating layers and the gate insulating layers. A second dielectric etch stop layer is directly on and continuous over the first dielectric etch stop layer, the second dielectric etch stop layer distinct from the first dielectric etch stop layer. A third dielectric etch stop layer is directly on and continuous over the second dielectric etch stop layer, the third dielectric etch stop layer distinct from the second dielectric etch stop layer. An interlayer dielectric material is on the third dielectric etch stop layer. An opening is in the interlayer dielectric material, in the third dielectric etch stop layer, in the second dielectric etch stop layer, in the first dielectric etch stop layer, and in one of the trench insulating layers. A conductive structure is in the opening, the conductive structure in direct contact with a corresponding one of the trench contact structures.

Example embodiment 7: The integrated circuit structure of example embodiment 6, wherein the first and third dielectric etch stop layers include aluminum and oxygen.

Example embodiment 8: The integrated circuit structure of example embodiment 6 or 7, wherein the second etch stop layer includes nitrogen, silicon and hydrogen.

Example embodiment 9: The integrated circuit structure of example embodiment 6, 7 or 8, wherein the interlayer dielectric material includes silicon, oxygen, carbon and hydrogen.

Example embodiment 10: The integrated circuit structure of example embodiment 6, 7, 8 or 9, wherein the trench insulating layers include silicon carbide, and the gate insulating layers include silicon nitride.

Example embodiment 11: The integrated circuit structure of example embodiment 6, 7, 8, 9 or 10, further including a plurality of dielectric spacers alternating with the plurality of gate structures and the plurality of conductive trench contact structures, wherein the first dielectric etch stop layer is directly on the plurality of dielectric spacers.

Example embodiment 12: The integrated circuit structure of example embodiment 6, 7, 8, 9, 10 or 11, wherein the plurality of conductive trench contact structures and the plurality of gate structures are on a semiconductor fin.

Example embodiment 13: The integrated circuit structure of example embodiment 6, 7, 8, 9, 10, 11 or 12, wherein the conductive structure includes an upper conductive line and a lower conductive via.

Example embodiment 14: A computing device includes a board, and a component coupled to the board. The component includes an integrated circuit structure including a conductive line in a first interlayer dielectric material above a substrate. A first dielectric etch stop layer is directly on the conductive line and the first interlayer dielectric material. A second dielectric etch stop layer is directly on and continuous over the first dielectric etch stop layer, the second dielectric etch stop layer distinct from the first dielectric etch stop layer. A third dielectric etch stop layer is directly on and continuous over the second dielectric etch stop layer, the third dielectric etch stop layer distinct from the second dielectric etch stop layer. A second interlayer dielectric material is on the third dielectric etch stop layer. An opening is in the second interlayer dielectric material, in the third dielectric etch stop layer, and in the second dielectric etch stop layer, in the first dielectric etch stop layer. A conductive structure is in the opening, the conductive structure in direct contact with the conductive line.

Example embodiment 15: The computing device of example embodiment 14, further including a memory coupled to the board.

Example embodiment 16: The computing device of example embodiment 14 or 15, further including a communication chip coupled to the board.

Example embodiment 17: The computing device of example embodiment 14, 15 or 16, further including a camera coupled to the board.

Example embodiment 18: The computing device of example embodiment 14, 15, 16 or 17, wherein the component is a packaged integrated circuit die.

Example embodiment 19: A computing device includes a board, and a component coupled to the board. The component includes an integrated circuit structure including a plurality of gate structures above substrate, each of the gate structures including a gate insulating layer thereon. A plurality of conductive trench contact structures is alternating with the plurality of gate structures, each of the conductive trench contact structures including a trench insulating layer thereon. A first dielectric etch stop layer is directly on and continuous over the trench insulating layers and the gate insulating layers. A second dielectric etch stop layer is directly on and continuous over the first dielectric etch stop layer, the second dielectric etch stop layer distinct from the first dielectric etch stop layer. A third dielectric etch stop layer is directly on and continuous over the second dielectric etch stop layer, the third dielectric etch stop layer distinct from the second dielectric etch stop layer. An interlayer dielectric material is on the third dielectric etch stop layer. An opening is in the interlayer dielectric material, in the third dielectric etch stop layer, in the second dielectric etch stop layer, in the first dielectric etch stop layer, and in one of the trench insulating layers. A conductive structure is in the opening, the conductive structure in direct contact with a corresponding one of the trench contact structures.

Example embodiment 20: The computing device of example embodiment 19, further including a memory coupled to the board.

Example embodiment 21: The computing device of example embodiment 19 or 20, further including a communication chip coupled to the board.

Example embodiment 22: The computing device of example embodiment 19, 20 or 21, further including a camera coupled to the board.

Example embodiment 23: The computing device of example embodiment 19, 20, 21 or 22, wherein the component is a packaged integrated circuit die.

What is claimed is:
1. An integrated circuit structure, comprising:
a conductive line in a first interlayer dielectric material above a substrate;
a first dielectric etch stop layer directly on the conductive line and the first interlayer dielectric material, the first etch stop layer comprising 35-40 atomic % aluminum and 60-65% atomic % oxygen;

a second dielectric etch stop layer directly on and continuous over the first dielectric etch stop layer, the second dielectric etch stop layer distinct from the first dielectric etch stop layer;
a third dielectric etch stop layer directly on and continuous over the second dielectric etch stop layer, the third dielectric etch stop layer distinct from the second dielectric etch stop layer;
a second interlayer dielectric material on the third dielectric etch stop layer;
an opening in the second interlayer dielectric material, in the third dielectric etch stop layer, in the second dielectric etch stop layer, and in the first dielectric etch stop layer; and
a conductive structure in the opening, the conductive structure in direct contact with the conductive line.

2. The integrated circuit structure of claim 1, wherein the third dielectric etch stop layer comprises aluminum and oxygen.

3. The integrated circuit structure of claim 1, wherein the second etch stop layer comprises nitrogen, silicon and hydrogen.

4. The integrated circuit structure of claim 1, wherein the second interlayer dielectric material comprises silicon, oxygen, carbon and hydrogen.

5. The integrated circuit structure of claim 1, wherein the conductive structure includes an upper conductive line and a lower conductive via.

6. An integrated circuit structure, comprising:
a plurality of gate structures above substrate, each of the gate structures including a gate insulating layer thereon, the gate insulating layer having an uppermost surface;
a plurality of conductive trench contact structures alternating with the plurality of gate structures, each of the conductive trench contact structures including a trench insulating layer thereon, the trench insulating layer having an uppermost surface at a same level as the uppermost surface of the gate insulating layer;
a first dielectric etch stop layer directly on and continuous over the trench insulating layers and the gate insulating layers;
a second dielectric etch stop layer directly on and continuous over the first dielectric etch stop layer, the second dielectric etch stop layer distinct from the first dielectric etch stop layer;
a third dielectric etch stop layer directly on and continuous over the second dielectric etch stop layer, the third dielectric etch stop layer distinct from the second dielectric etch stop layer;
an interlayer dielectric material on the third dielectric etch stop layer;
an opening in the interlayer dielectric material, in the third dielectric etch stop layer, in the second dielectric etch stop layer, in the first dielectric etch stop layer, and in one of the trench insulating layers; and
a conductive structure in the opening, the conductive structure in direct contact with a corresponding one of the trench contact structures, the conductive structure having a bottommost surface below a bottommost surface of the first dielectric etch stop layer.

7. The integrated circuit structure of claim 6, wherein the first and third dielectric etch stop layers comprise aluminum and oxygen.

8. The integrated circuit structure of claim 6, wherein the second etch stop layer comprises nitrogen, silicon and hydrogen.

9. The integrated circuit structure of claim 6, wherein the interlayer dielectric material comprises silicon, oxygen, carbon and hydrogen.

10. The integrated circuit structure of claim 6, wherein the trench insulating layers comprise silicon carbide, and the gate insulating layers comprise silicon nitride.

11. The integrated circuit structure of claim 6, further comprising:
a plurality of dielectric spacers alternating with the plurality of gate structures and the plurality of conductive trench contact structures, wherein the first dielectric etch stop layer is directly on the plurality of dielectric spacers.

12. The integrated circuit structure of claim 6, wherein the plurality of conductive trench contact structures and the plurality of gate structures are on a semiconductor fin.

13. The integrated circuit structure of claim 6, wherein the conductive structure includes an upper conductive line and a lower conductive via.

14. A computing device, comprising:
a board; and
a component coupled to the board, the component including an integrated circuit structure, comprising:
a conductive line in a first interlayer dielectric material above a substrate;
a first dielectric etch stop layer directly on the conductive line and the first interlayer dielectric material, the first etch stop layer comprising 35-40 atomic % aluminum and 60-65% atomic % oxygen;
a second dielectric etch stop layer directly on and continuous over the first dielectric etch stop layer, the second dielectric etch stop layer distinct from the first dielectric etch stop layer;
a third dielectric etch stop layer directly on and continuous over the second dielectric etch stop layer, the third dielectric etch stop layer distinct from the second dielectric etch stop layer;
a second interlayer dielectric material on the third dielectric etch stop layer;
an opening in the second interlayer dielectric material, in the third dielectric etch stop layer, in the second dielectric etch stop layer, and in the first dielectric etch stop layer; and
a conductive structure in the opening, the conductive structure in direct contact with the conductive line.

15. The computing device of claim 14, further comprising:
a memory coupled to the board.

16. The computing device of claim 14, further comprising:
a communication chip coupled to the board.

17. The computing device of claim 14, further comprising:
a camera coupled to the board.

18. The computing device of claim 14, wherein the component is a packaged integrated circuit die.

19. A computing device, comprising:
a board; and
a component coupled to the board, the component including an integrated circuit structure, comprising:
a plurality of gate structures above substrate, each of the gate structures including a gate insulating layer thereon, the gate insulating layer having an uppermost surface;
a plurality of conductive trench contact structures alternating with the plurality of gate structures, each of the conductive trench contact structures including a trench insulating layer thereon, the trench insulating layer having an uppermost surface at a same level as the uppermost surface of the gate insulating layer;

a first dielectric etch stop layer directly on and continuous over the trench insulating layers and the gate insulating layers;

a second dielectric etch stop layer directly on and continuous over the first dielectric etch stop layer, the second dielectric etch stop layer distinct from the first dielectric etch stop layer;

a third dielectric etch stop layer directly on and continuous over the second dielectric etch stop layer, the third dielectric etch stop layer distinct from the second dielectric etch stop layer;

an interlayer dielectric material on the third dielectric etch stop layer;

an opening in the interlayer dielectric material, in the third dielectric etch stop layer, in the second dielectric etch stop layer, in the first dielectric etch stop layer, and in one of the trench insulating layers; and a conductive structure in the opening, the conductive structure in direct contact with a corresponding one of the trench contact structures, the conductive structure having a bottommost surface below a bottommost surface of the first dielectric etch stop layer.

20. The computing device of claim 19, further comprising:

a memory coupled to the board.

21. The computing device of claim 19, further comprising:

a communication chip coupled to the board.

22. The computing device of claim 19, further comprising:

a camera coupled to the board.

23. The computing device of claim 19, wherein the component is a packaged integrated circuit die.

* * * * *